US012736873B2

(12) United States Patent
Shih

(10) Patent No.: US 12,736,873 B2
(45) Date of Patent: Sep. 15, 2026

(54) METHODS FOR FABRICATING AN OPTICAL WAVEGUIDE AND A DISPLAY DEVICE AND PHOTOMASK USED THEREIN

(71) Applicants: INTERFACE TECHNOLOGY (CHENGDU) CO., LTD., Chengdu City (CN); INTERFACE OPTOELECTRONICS (SHENZHEN) CO., LTD., Shenzhen City (CN); GENERAL INTERFACE SOLUTION LIMITED, Zhunan Township (TW)

(72) Inventor: Hung-Hsin Shih, Shenzhen City (CN)

(73) Assignees: Interface Technology (ChengDu) Co., Ltd., Chengdu City (CN); Interface Optoelectronics (Shenzhen) Co., Ltd., Shenzhen City (CN); General Interface Solution Limited, Miaoli County (TW)

( * ) Notice: Subject to any disclaimer, the term of this patent is extended or adjusted under 35 U.S.C. 154(b) by 609 days.

(21) Appl. No.: 17/569,809

(22) Filed: Jan. 6, 2022

(65) Prior Publication Data

US 2023/0152690 A1 May 18, 2023

(30) Foreign Application Priority Data

Nov. 18, 2021 (CN) ......................... 202111369726.9

(51) Int. Cl.
*G03F 7/00* (2006.01)
*G02B 6/10* (2006.01)
(Continued)

(52) U.S. Cl.
CPC ............. *G03F 7/0007* (2013.01); *G02B 6/10* (2013.01); *G02B 27/0172* (2013.01); *G03F 1/54* (2013.01); *G02B 2027/0178* (2013.01)

(58) Field of Classification Search
CPC ........... G03F 7/0007; G03F 1/54; G02B 6/10; G02B 27/0172; G02B 2027/0178
See application file for complete search history.

(56) References Cited

U.S. PATENT DOCUMENTS

2007/0081758 A1* 4/2007 Tono .................. G01N 21/7703 385/12
2019/0163051 A1* 5/2019 Chang .................. G03F 7/2004
(Continued)

FOREIGN PATENT DOCUMENTS

JP H-0571994 A * 3/1993 ............. G01D 13/02

OTHER PUBLICATIONS

English machine translation of JPH-0571994-A (Mar. 1993) (Year: 1993).*

*Primary Examiner* — Jonathan Johnson
*Assistant Examiner* — Jayson D Cosgrove
(74) *Attorney, Agent, or Firm* — Rosenberg, Klein & Lee

(57) ABSTRACT

Methods for fabricating an optical waveguide and a display device and a photomask used therein is provided. Firstly, a photomask is provided, wherein the photomask has light blocking structures regularly distributed. A first light curing resin layer is formed on a first transparent substrate. Next, the photomask is placed on the first light curing resin layer. The first light curing resin layer is irradiated and cured with incident light through the photomask and the light blocking structures to have a first curing level and a first refractive index. The first curing level and the first refractive index, corresponding to each other, are periodically distributed. Finally, the photomask is removed from the first light curing resin layer to form an optical waveguide with the first light curing resin layer having the first curing level that is periodically distributed and the first transparent substrate.

39 Claims, 11 Drawing Sheets

(51) Int. Cl.
*G02B 27/01* (2006.01)
*G03F 1/54* (2012.01)

(56) References Cited

U.S. PATENT DOCUMENTS

| | | | | |
|---|---|---|---|---|
| 2019/0206136 | A1* | 7/2019 | West | G02B 5/1814 |
| 2019/0278005 | A1* | 9/2019 | Young | G02B 30/26 |
| 2020/0292753 | A1* | 9/2020 | Maeda | G02B 6/1223 |
| 2021/0263342 | A1* | 8/2021 | Ouderkirk | G02B 27/0172 |

* cited by examiner

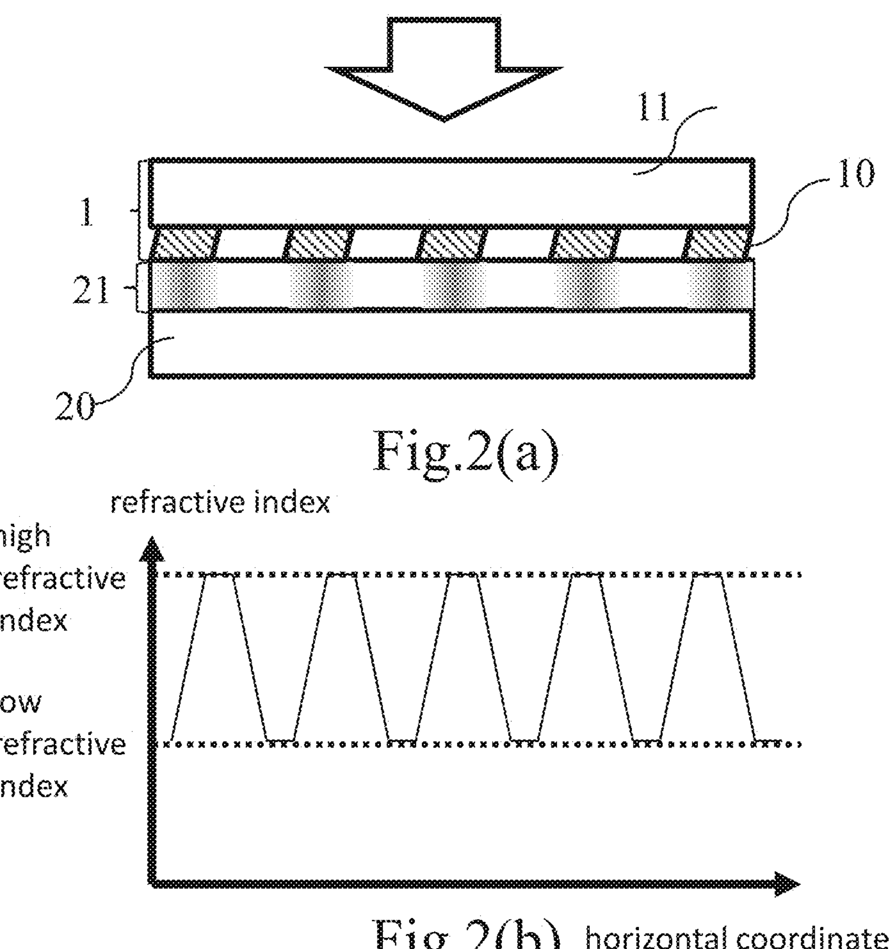
Fig.2(a)
Fig.2(b)
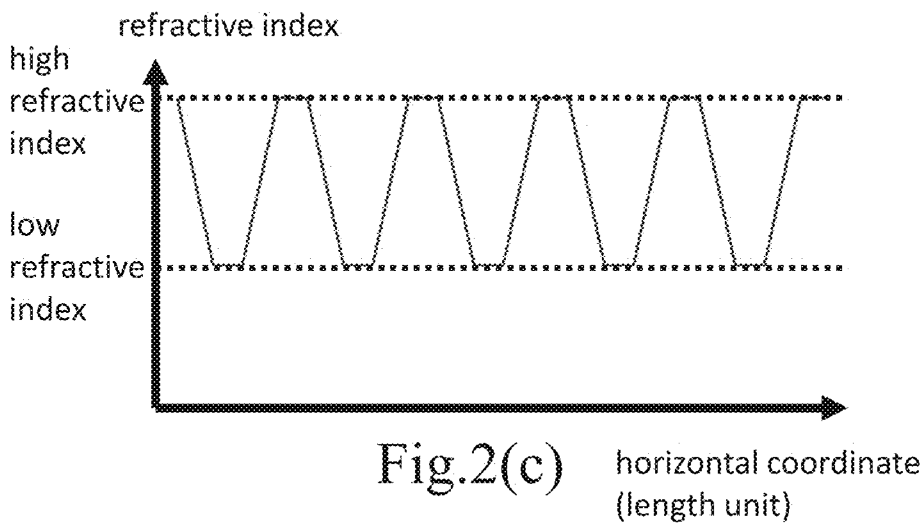
Fig.2(c)

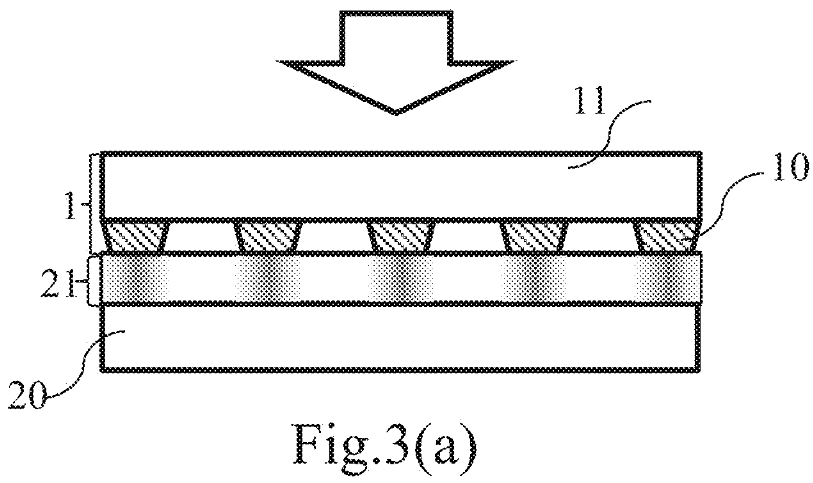
Fig.3(a)
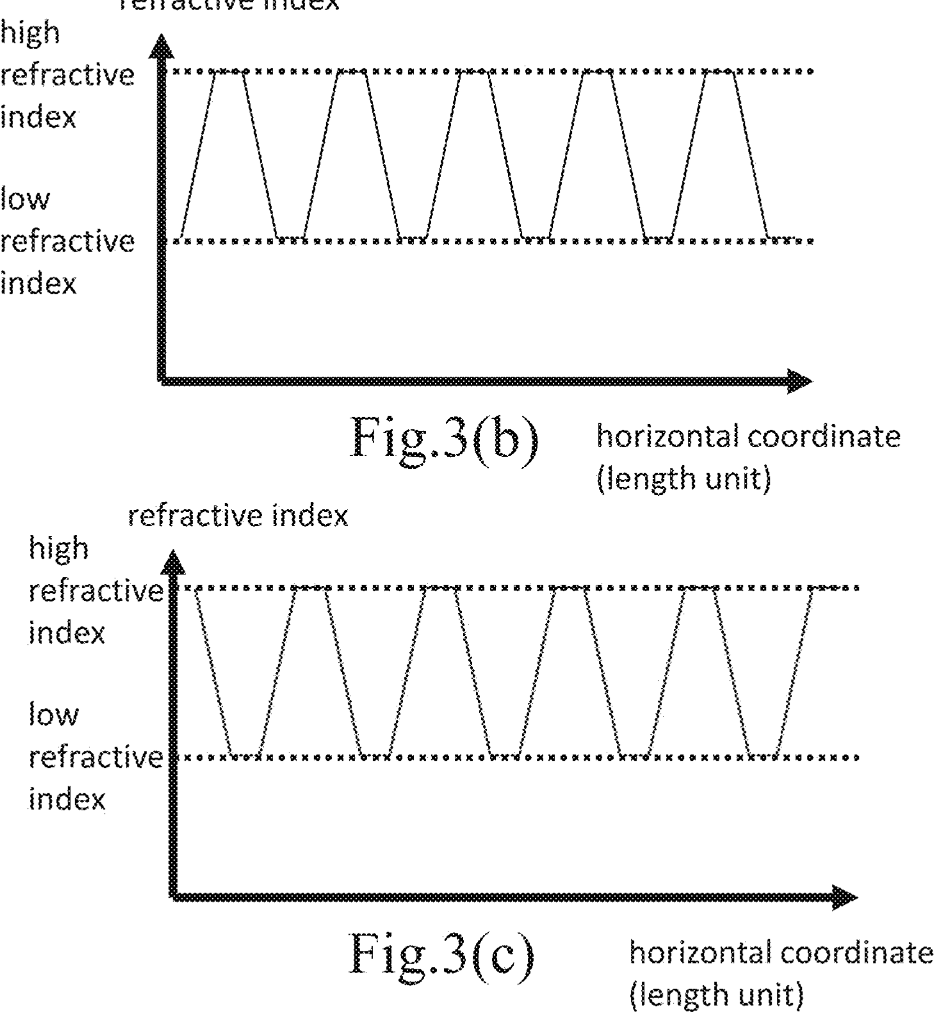
Fig.3(b)
Fig.3(c)

METHODS FOR FABRICATING AN OPTICAL WAVEGUIDE AND A DISPLAY DEVICE AND PHOTOMASK USED THEREIN

This application claims priority of Application No. 202111369726.9 filed in mainland China (P.R.C.) on 18 Nov. 2021 under 35 U.S.C. § 119; the entire contents of all of which are hereby incorporated by reference.

BACKGROUND OF THE INVENTION

Field of the Invention

The present invention relates to an optical technology, particularly to methods for fabricating an optical waveguide and a display device and a photomask used therein.

Description of the Related Art

In augmented reality, the light is coupled into the glass substrate of an optical waveguide. The light is transmitted to the front of an eye based on the principle of total reflection, and then the image information is released. Geometric grating waveguide, surface relief grating waveguide and volumetric holographic grating waveguide are mainly used as optical waveguides. With these technologies, structures or films with periodic refractive index differences or periodic optical path differences are produced to couple images for transmitting light and guide light generated by a display system to a human eye.

The geometric optical waveguide needs to stack and glue reflectors arranged into an array. The reflectors need to have dozens of layers to be effective. The reflector is cut into the shape of the waveguide at the required angle. The parallelism and cutting angle of the surface of the reflector will affect the imaging quality. The surface relief grating waveguide requires a mother mold and a photolithography technology to form microstructures. For example, nano-scale microstructures are fabricated by nanoimprinting, and modified by multiple processes. These processes include exposure, etching, and deposition processes. The fabrication processes are more complex. The volumetric holographic grating waveguide uses two lasers to form interference fringes to change the material properties of the grating and form a periodic refractive index difference. Because the volumetric holographic grating waveguide requires an optical exposure system, its fabrication cost is relatively high.

To overcome the abovementioned problems, the present invention provides methods for fabricating an optical waveguide and a display device and a photomask used therein, so as to solve the afore-mentioned problems of the prior art.

SUMMARY OF THE INVENTION

The present invention provides methods for fabricating an optical waveguide and a display device and a photomask used therein, which form a light curing resin layer with a periodically varying refractive index and replace deposition and etching processes to improve the performance of a surface relief grating waveguide. The method features low cost and simple fabrication.

In an embodiment of the present invention, a method for fabricating an optical waveguide includes: providing a photomask and forming a first light curing resin layer on a first transparent substrate, wherein the photomask has light blocking structures that are regularly distributed; placing the photomask on the first light curing resin layer; irradiating and curing the first light curing resin layer to have a first curing level and a corresponding first refractive index with incident light through the photomask and the light blocking structures, wherein the first curing level and the first refractive index are periodically distributed; and removing the photomask from the first light curing resin layer to form an optical waveguide with the first light curing resin layer having the periodically distributed first curing level and the first transparent substrate.

In an embodiment of the present invention, the incident light is ultraviolet light.

In an embodiment of the present invention, the light blocking structure includes oxides that absorb the ultraviolet light, ultraviolet light scattering particles or a combination of these.

In an embodiment of the present invention, the oxides include titanium dioxide, zinc oxide, cerium dioxide or a combination of these.

In an embodiment of the present invention, a part of energy of the incident light is absorbed or shielded by the light blocking structures and the remaining energy of the incident light is applied to the first light curing resin layer.

In an embodiment of the present invention, the quantity of the oxides of the light blocking structure is positively correlated with the energy of the ultraviolet light absorbed by the light blocking structure.

In an embodiment of the present invention, the quantity of the ultraviolet light scattering particles of the light blocking structure is positively correlated with the energy of the ultraviolet light shielded by the light blocking structure.

In an embodiment of the present invention, the quantity of the oxides or the ultraviolet light scattering particles of the light blocking structure is negatively correlated with the first curing level of the corresponding first light curing resin layer.

In an embodiment of the present invention, the first light curing resin layer is an ultraviolet light curing resin layer.

In an embodiment of the present invention, the first light curing resin layer comprises acrylic amine(AA)-based photopolymers, polyvinyl alcohol (PVA)-based photopolymers, acrylate-based photopolymers, thiol-ene based photopolymers, photopolymers doped with nanoparticles, or a combination of these.

In an embodiment of the present invention, the photomask further includes a second transparent substrate. The second transparent substrate is provided with the light blocking structures. The light blocking structure has a shape of a polygon, a circle, a semicircle, an oval, or a semi-ellipse in cross section.

In an embodiment of the present invention, the polygon is a square, a rectangle, a parallelogram, a trapezoid, a right-angled trapezoid, an isosceles trapezoid, a triangle, a right-angled triangle, or an isosceles triangle.

In an embodiment of the present invention, after the step of removing the photomask from the first light curing resin layer and before the step of forming the optical waveguide with the first light curing resin layer having the periodically distributed the first curing level and the first transparent substrate, at least one light curing process is performed. The light curing process includes: forming a second light curing resin layer on the latest formed light curing resin layer; placing the photomask on the latest formed second light curing resin layer and irradiating and curing the latest formed second light curing resin layer to have a second curing level and a corresponding second refractive index with the incident light through the photomask and the light blocking structures, wherein the second curing level and the second refractive index are periodically distributed; and removing the photomask from the latest formed second light curing resin layer. In the step of forming the optical waveguide with the first light curing resin layer having the periodically distributed the first curing level and the first transparent substrate, the optical waveguide with the first light curing resin layer having the periodically distributed the first curing level, the second light curing resin layer having the periodically distributed the second curing level, and the first transparent substrate is formed.

In an embodiment of the present invention, the thickness of the light blocking structure is negatively correlated with the corresponding second curing level.

In an embodiment of the present invention, the second curing level is positively or negatively correlated with the corresponding second refractive index.

In an embodiment of the present invention, the first curing level and the second curing level are equal or unequal along a direction vertical to the surface of the first transparent substrate.

In an embodiment of the present invention, the second light curing resin layer is an ultraviolet light curing resin layer.

In an embodiment of the present invention, the second light curing resin layer comprises acrylic amine(AA)-based photopolymers, polyvinyl alcohol (PVA)-based photopolymers, acrylate-based photopolymers, thiol-ene based photopolymers, photopolymers doped with nanoparticles, or a combination of these.

In an embodiment of the present invention, gratings that separate from each other are formed between the first transparent substrate and the first light curing resin layer.

In an embodiment of the present invention, the gratings and the light blocking structures have the same or different positions along a direction parallel to the surface of the first transparent substrate.

In an embodiment of the present invention, the thickness of the light blocking structure is negatively correlated with the first curing level of the corresponding first light curing resin layer.

In an embodiment of the present invention, the first curing level is positively or negatively correlated with the corresponding first refractive index.

In an embodiment of the present invention, a method for fabricating a display device includes: providing a photomask and forming a first light curing resin layer on a first transparent substrate, wherein the photomask has light blocking structures that are regularly distributed; placing the photomask on the first light curing resin layer; irradiating and curing the first light curing resin layer to have a first curing level and a corresponding first refractive index with incident light through the photomask and the light blocking structures, wherein the first curing level and the first refractive index are periodically distributed; removing the photomask from the first light curing resin layer to form an optical waveguide with the first light curing resin layer having the periodically distributed first curing level and the first transparent substrate; and connecting a body with a display module and the optical waveguide to form a display device.

In an embodiment of the present invention, the body is an eyeglass frame.

In an embodiment of the present invention, the incident light is ultraviolet light.

In an embodiment of the present invention, the light blocking structure includes oxides that absorb the ultraviolet light, ultraviolet light scattering particles or a combination of these.

In an embodiment of the present invention, the oxides include titanium dioxide, zinc oxide, cerium dioxide or a combination of these.

In an embodiment of the present invention, a part of energy of the incident light is absorbed or shielded by the light blocking structures and the remaining energy of the incident light is applied to the first light curing resin layer.

In an embodiment of the present invention, the quantity of the oxides of the light blocking structure is positively correlated with the energy of the ultraviolet light absorbed by the light blocking structure.

In an embodiment of the present invention, the quantity of the ultraviolet light scattering particles of the light blocking structure is positively correlated with the energy of the ultraviolet light shielded by the light blocking structure.

In an embodiment of the present invention, the quantity of the oxides or the ultraviolet light scattering particles of the light blocking structure is negatively correlated with the first curing level of the corresponding first light curing resin layer.

In an embodiment of the present invention, the first light curing resin layer is an ultraviolet light curing resin layer.

In an embodiment of the present invention, the first light curing resin layer comprises acrylic amine(AA)-based photopolymers, polyvinyl alcohol (PVA)-based photopolymers, acrylate-based photopolymers, thiol-ene based photopolymers, photopolymers doped with nanoparticles, or a combination of these.

In an embodiment of the present invention, the photomask further includes a second transparent substrate. The second transparent substrate is provided with the light blocking structures. The light blocking structure has a shape of a polygon, a circle, a semicircle, an oval, or a semi-ellipse in cross section.

In an embodiment of the present invention, the polygon is a square, a rectangle, a parallelogram, a trapezoid, a right-angled trapezoid, an isosceles trapezoid, a triangle, a right-angled triangle, or an isosceles triangle.

In an embodiment of the present invention, after the step of removing the photomask from the first light curing resin layer and before the step of forming the optical waveguide with the first light curing resin layer having the periodically distributed the first curing level and the first transparent substrate, at least one light curing process is performed. The light curing process includes: forming a second light curing resin layer on the latest formed light curing resin layer; placing the photomask on the latest formed second light curing resin layer and irradiating and curing the latest formed second light curing resin layer to have a second curing level and a corresponding second refractive index with the incident light through the photomask and the light blocking structures, wherein the second curing level and the second refractive index are periodically distributed; and removing the photomask from the latest formed second light curing resin layer. In the step of forming the optical waveguide with the first light curing resin layer having the periodically distributed the first curing level and the first transparent substrate, the optical waveguide with the first light curing resin layer having the periodically distributed the first curing level, the second light curing resin layer having the periodically distributed the second curing level, and the first transparent substrate is formed.

In an embodiment of the present invention, the thickness of the light blocking structure is negatively correlated with the corresponding second curing level.

In an embodiment of the present invention, the second curing level is positively or negatively correlated with the corresponding second refractive index.

In an embodiment of the present invention, the first curing level and the second curing level are equal or unequal along a direction vertical to the surface of the first transparent substrate.

In an embodiment of the present invention, the second light curing resin layer is an ultraviolet light curing resin layer.

In an embodiment of the present invention, the second light curing resin layer comprises acrylic amine(AA)-based photopolymers, polyvinyl alcohol (PVA)-based photopolymers, acrylate-based photopolymers, thiol-ene based photopolymers, photopolymers doped with nanoparticles, or a combination of these.

In an embodiment of the present invention, gratings that separate from each other are formed between the first transparent substrate and the first light curing resin layer.

In an embodiment of the present invention, the gratings and the light blocking structures have the same or different positions along a direction parallel to the surface of the first transparent substrate.

In an embodiment of the present invention, the thickness of the light blocking structure is negatively correlated with the first curing level of the corresponding first light curing resin layer.

In an embodiment of the present invention, the first curing level is positively or negatively correlated with the corresponding first refractive index.

In an embodiment of the present invention, a photomask includes a transparent substrate and a plurality of light blocking structures regularly distributed on the surface of the transparent substrate, wherein each of the plurality of light blocking structures has a geometric shape in cross section.

In an embodiment of the present invention, the plurality of light blocking structures include oxides that absorb the ultraviolet light, ultraviolet light scattering particles or a combination of these.

In an embodiment of the present invention, the oxides comprise titanium dioxide, zinc oxide, cerium dioxide or a combination of these.

In an embodiment of the present invention, the geometric shape is a polygon, a circle, a semicircle, an oval, or a semi-ellipse.

In an embodiment of the present invention, the polygon is a square, a rectangle, a parallelogram, a trapezoid, a right-angled trapezoid, an isosceles trapezoid, a triangle, a right-angled triangle, or an isosceles triangle.

To sum up, the methods for fabricating an optical waveguide and a display device and the photomask used therein use a single exposure process to form a light curing resin layer with a periodically varying refractive index and a periodically distributed curing level on the surface relief grating waveguide, thereby replacing deposition and etching processes and improving the performance of the surface relief grating waveguide. The method features low cost and simple fabrication.

Below, the embodiments are described in detail in cooperation with the drawings to make easily understood the technical contents, characteristics and accomplishments of the present invention.

BRIEF DESCRIPTION OF THE DRAWINGS

FIG. 1(*d*) is a schematic diagram illustrating the distribution of a refractive index corresponding to FIG. 1(*c*);

FIG. 2(*a*) is a cross-sectional view of irradiating a photomask, a first light curing resin layer, and a first transparent substrate with ultraviolet light according to an embodiment of the present invention;

FIGS. 2(*b*)-2(*c*) are schematic diagrams illustrating the distribution of a refractive index corresponding to FIG. 2(*a*);

FIG. 3(*a*) is a cross-sectional view of irradiating a photomask, a first light curing resin layer, and a first transparent substrate with ultraviolet light according to another embodiment of the present invention;

FIGS. 3(*b*)-3(*c*) are schematic diagrams illustrating the distribution of a refractive index corresponding to FIG. 3(*a*);

FIGS. 4(*b*)-4(*c*) are schematic diagrams illustrating the distribution of a refractive index corresponding to FIG. 4(*a*);

FIGS. 5(*b*)-5(*c*) are schematic diagrams illustrating the distribution of a refractive index corresponding to FIG. 5(*a*);

FIGS. 6(*b*)-6(*c*) are schematic diagrams illustrating the distribution of a refractive index corresponding to FIG. 6(*a*);

DETAILED DESCRIPTION OF THE INVENTION

Figures 1A, 1B, 1C, 1D:
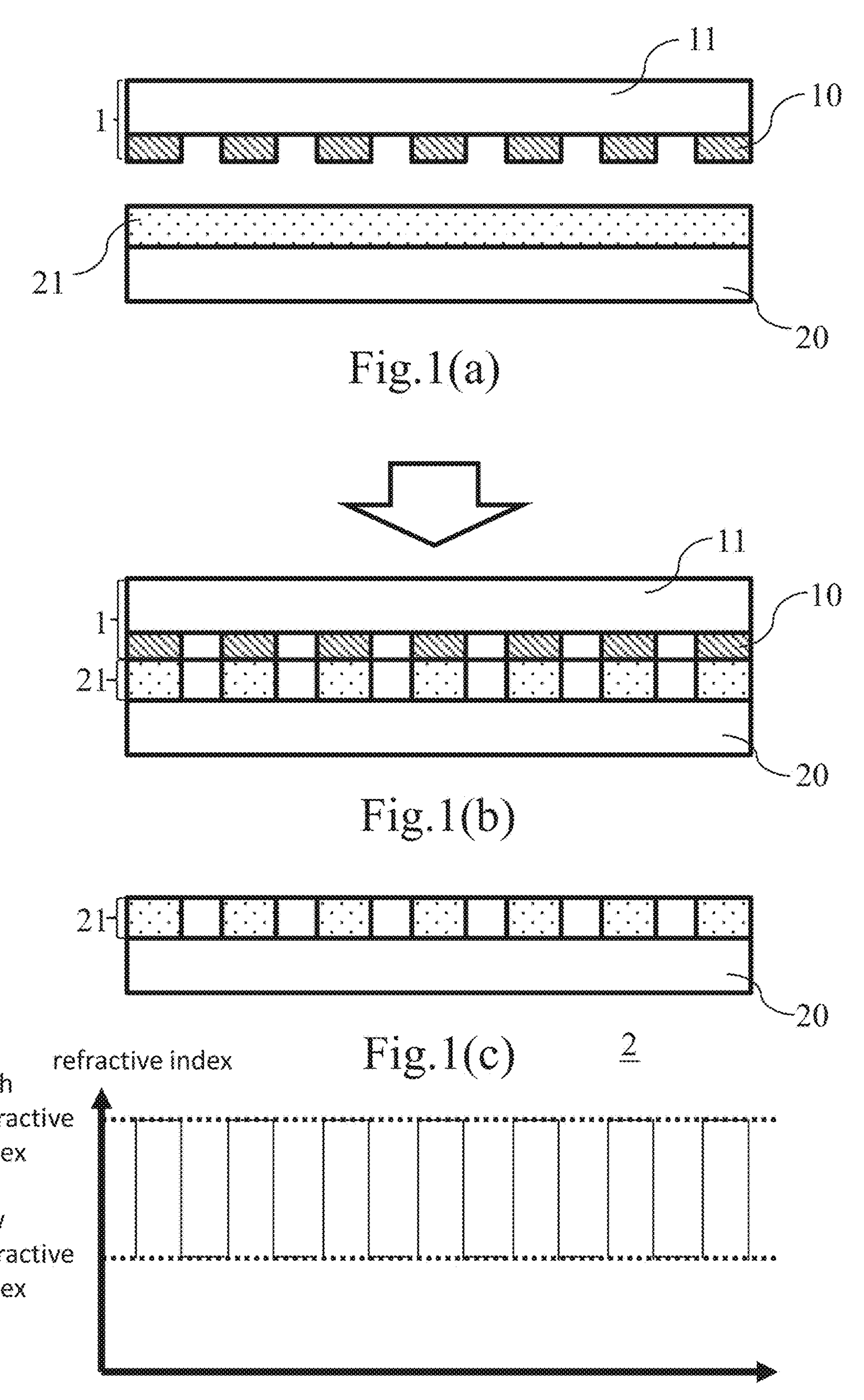
FIGS. 1(*a*)-1(*c*) are schematic diagrams illustrating the steps of fabricating an optical waveguide according to a first embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Throughout the description and claims, it will be understood that when a component is referred to as being “positioned on,” “positioned above,” “connected to,” “engaged with,” or “coupled with” another component, it can be directly on, directly connected to, or directly engaged with the other component, or intervening component may be present. In contrast, when a component is referred to as being "directly on," "directly connected to," or "directly engaged with" another component, there are no intervening components present. The term "and/or" may comprise any and all combinations of one or more of the associated listed items.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, specific components, structures, and features in one or more embodiments can be combined in an appropriate manner.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

Furthermore, it can be understood that the terms "comprising," "including," "having," "containing," and "involving" are open-ended terms, which refer to "may include but is not limited to so." Besides, each of the embodiments or claims of the present invention is not necessary to achieve all the effects and advantages possibly to be generated, and the abstract and title of the present invention is used to assist for patent search and is not used to further limit the claimed scope of the present invention.

Methods for fabricating an optical waveguide and a display device and a photomask used therein will be provided. The method uses a single exposure process to form a light curing resin layer with a periodically varying refractive index and a periodically distributed curing level on a grating, such as a surface relief grating waveguide, thereby replacing subsequent deposition and etching processes and improving the performance of the surface relief grating waveguide. The method features low cost and simple fabrication.

FIGS. 1(*a*)-1(*c*) are schematic diagrams illustrating the steps of fabricating an optical waveguide according to a first embodiment of the present invention. FIG. 1(*d*) is a schematic diagram illustrating the distribution of a refractive index corresponding to FIG. 1(*c*). The method for fabricating an optical waveguide is introduced as follows. As illustrated in FIG. 1(*a*), a photomask 1 is provided, wherein the photomask 1 has a plurality of light blocking structures 10 that are regularly distributed. A first light curing resin layer 21 is formed on a first transparent substrate 20. The photomask 1 may further include a second transparent substrate 11. The surface of the second transparent substrate 11 is provided with the light blocking structures 10. The light blocking structures 10 are spaced at uniform intervals. The light blocking structures 10 may be deposited on the second transparent substrate 11, but the present invention is not limited thereto. For example, the first transparent substrate 20 and the second transparent substrate 11 may be glass substrates or other transparent substrates. The light blocking structure 10 has a geometric shape in cross section. In the first embodiment, the light blocking structure 10 may have a shape of a rectangular in cross section, but the present invention is not limited thereto. Then, as illustrated in FIG. 1(*b*), the photomask 1 is placed on the first light curing resin layer 21. The first light curing resin layer 21 is irradiated and cured to have a first curing level and a corresponding first refractive index with incident light through the photomask 1 and the light blocking structures 10. The first curing level and the first refractive index are periodically distributed. The direction of the incident light is represented with an arrow. The light blocking structures 10 can scatter or absorb the incident light. The blank areas of the first light curing resin layer 21 represent completely cured areas and the dot areas of the first light curing resin layer 21 represent areas blocked by the light blocking structures 10. Specifically, a part of energy of the incident light is absorbed or shielded by the light blocking structures 10 and the remaining energy of the incident light is applied to the first light curing resin layer 21. For example, the incident light may be ultraviolet light. The first light curing resin layer 21 may be an ultraviolet light curing resin layer. The first light curing resin layer 21 may include acrylic amine(AA)-based photopolymers, polyvinyl alcohol (PVA)-based photopolymers, acrylate-based photopolymers, thiol-ene based photopolymers, photopolymers doped with nanoparticles, or a combination of these. The light blocking structure 10 may include oxides that absorb the ultraviolet light, metal oxides, ultraviolet light scattering particles or a combination of these, wherein the oxides include titanium dioxide, zinc oxide, cerium dioxide or a combination of these. The ultraviolet light scattering particles may have different diameters. The ultraviolet light scattering particles may include silicon dioxide, aluminum oxide, magnesium fluoride, calcium fluoride, lithium fluoride, magnesium oxide, or a combination of these. The energy of the ultraviolet light absorbed or shielded by the light blocking structure 10 depends on the thickness of the light blocking structure 10, or the quantities of the doped oxides or the doped ultraviolet light scattering particles. The oxides or the ultraviolet light scattering particles may be doped in the light blocking structures 10 using a sol-gel method, but the present invention is not limited thereto. The quantity of the oxides of the light blocking structure 10 is positively correlated with the energy of the ultraviolet light absorbed by the light blocking structure 10. For example, when the quantity of the oxides of the light blocking structure 10 is respectively large, medium, or small, the light blocking structure 10 respectively absorbs 75%, 50%, or 25% of energy of the ultraviolet light. The quantity of the ultraviolet light scattering particles of the light blocking structure 10 is positively correlated with the energy of the ultraviolet light shielded by the light blocking structure 10. For example, when the quantity of the ultraviolet light scattering particles of the light blocking structure 10 is respectively large, medium, or small, the light blocking structure 10 respectively shields 75%, 50%, or 25% of energy of the ultraviolet light. The quantity of the oxides or the ultraviolet light scattering particles of the light blocking structure 10 is negatively correlated with the first curing level of the corresponding first light curing resin layer 21. The thickness of the light blocking structure 10 is negatively correlated with the first curing level of the corresponding first light curing resin layer 21. That is to say, the more energy of ultraviolet light the light blocking structure 10 absorbs or shields, the lower the first curing level. The less energy of ultraviolet light the light blocking structure 10 absorbs or shields, the higher the first curing level. According to requirements, the first refractive index of the first light curing resin layer 21 is positively or negatively correlated with the corresponding first curing level. Finally, as illustrated in FIG. 1(*c*), the photomask 1 is removed from the first light curing resin layer 21 to form an optical waveguide 2 with the first light curing resin layer 21 having the periodically distributed first curing level and the first transparent substrate 20. As illustrated in FIG. 1(*c*) and FIG. 1(*d*), the refractive index of the first light curing resin layer 21 is periodically distributed along a horizontal coordinate axis in a horizontal direction that is parallel to the surface of the first transparent substrate 20 since the completely cured areas of the first light curing resin layer 21 have a low refractive index and the dot areas of the first light curing resin layer 21 have a high refractive index. Thus, the first light curing resin layer 21 can form a diffractive optical element. Since the first light curing resin layer 21 has the periodically distributed first curing level due to a single exposure process, the optical waveguide 2 features simple fabrication and low cost.

FIG. 2(*a*) is a cross-sectional view of irradiating a photomask, a first light curing resin layer, and a first transparent substrate with ultraviolet light according to an embodiment of the present invention. FIGS. 2(*b*)-2(*c*) are schematic diagrams illustrating the distribution of a refractive index corresponding to FIG. 2(*a*). FIG. 2(*a*) is different from FIG. 1(*b*) in the shape of the light blocking structure 10. As illustrated in FIG. 2(*a*), the light blocking structure 10 has a shape of a parallelogram in cross section. The shaded areas of the first light curing resin layer 21 are areas blocked by the light blocking structures 10. When the incident light penetrates through the middle area of the parallelogram, the light blocking structure 10 has a thicker thickness. When the incident light penetrates through the right or left side of the parallelogram, the light blocking structure 10 has a thinner thickness. As a result, as illustrated in FIG. 2(*b*) and FIG. 2(*c*), the first curing level of the shaded area of the first light curing resin layer 21 continuously increases from middle to two sides, such that the refractive index of the shaded area continuously increases or decreases from middle to two sides. For example, when the incident light does not penetrate through the light blocking structure 10, the light blocking structure 10 does not absorb the energy of the incident light and the refractive index of the first light curing resin layer 21 irradiated by the incident light can be 1.5. When the incident light penetrates through the light blocking structure 10 with a thinner thickness, the light blocking structure 10 absorbs 25% of the energy of the incident light and the refractive index of the first light curing resin layer 21 irradiated by the incident light can be 1.6. When the incident light penetrates through the light blocking structure 10 with a medium thickness, the light blocking structure 10 absorbs 50% of the energy of the incident light and the refractive index of the first light curing resin layer 21 irradiated by the incident light can be 1.7. When the incident light penetrates through the light blocking structure 10 with a thicker thickness, the light blocking structure 10 absorbs 100% of the energy of the incident light and the refractive index of the first light curing resin layer 21 irradiated by the incident light can be 1.8.

FIG. 3(*a*) is a cross-sectional view of irradiating a photomask, a first light curing resin layer, and a first transparent substrate with ultraviolet light according to another embodiment of the present invention. FIGS. 3(*b*)-3(*c*) are schematic diagrams illustrating the distribution of a refractive index corresponding to FIG. 3(*a*). FIG. 3(*a*) is different from FIG. 2(*a*) in the shape of the light blocking structure 10. As illustrated in FIG. 3(*a*), the light blocking structure 10 has a shape of an isosceles trapezoid in cross section. The shaded areas of the first light curing resin layer 21 are areas blocked by the light blocking structures 10. When the incident light penetrates through the middle area of the isosceles trapezoid, the light blocking structure 10 has a thicker thickness. When the incident light penetrates through the right or left side of the isosceles trapezoid, the light blocking structure 10 has a thinner thickness. As a result, as illustrated in FIG. 3(*b*) and FIG. 3(*c*), the first curing level of the shaded area of the first light curing resin layer 21 continuously increases from middle to two sides, such that the refractive index of the shaded area continuously increases or decreases from middle to two sides.

Figure 4A:
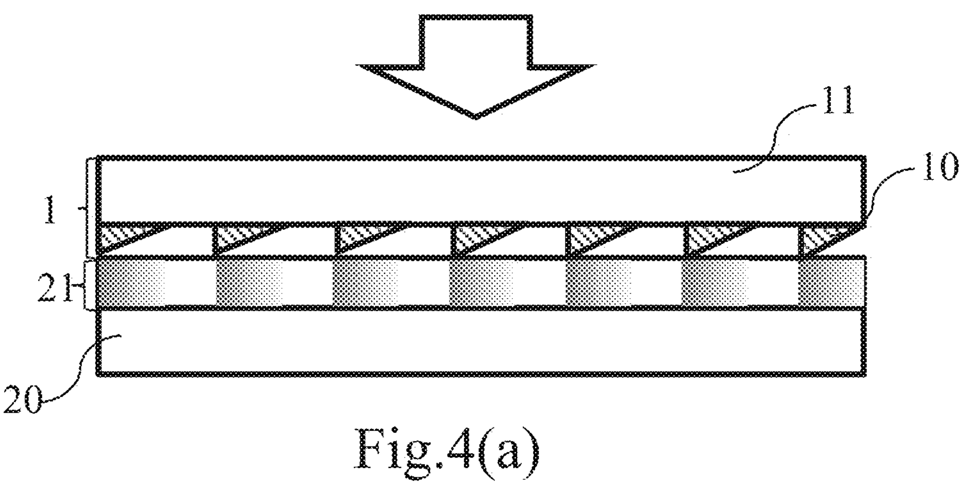
FIG. 4(*a*) is a cross-sectional view of irradiating a photomask, a first light curing resin layer, and a first transparent substrate with ultraviolet light according to further embodiment of the present invention.
Figure 4B:
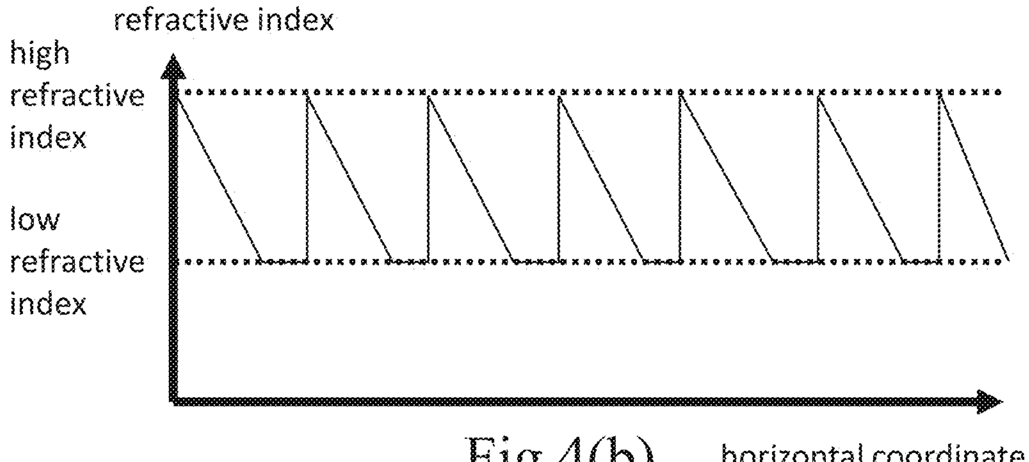
Figure 4C:
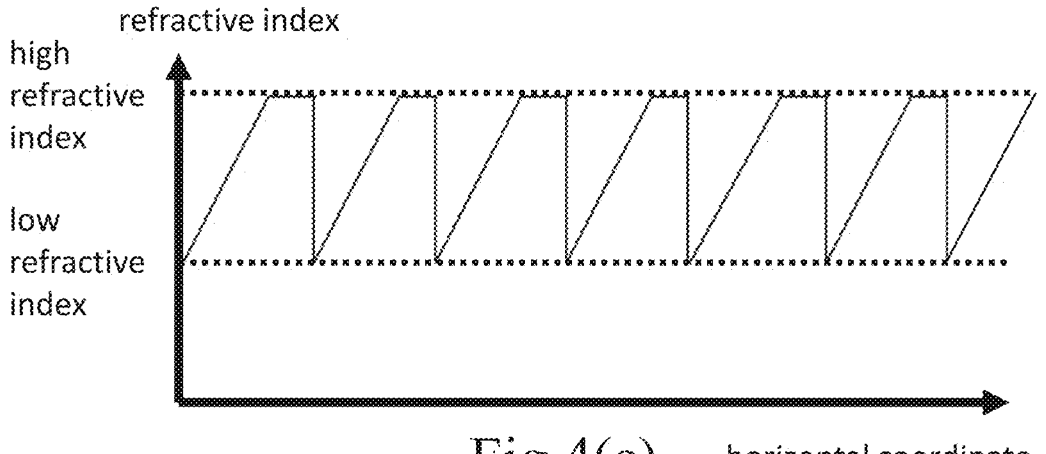

FIG. 4(*a*) is a cross-sectional view of irradiating a photomask, a first light curing resin layer, and a first transparent substrate with ultraviolet light according to further embodiment of the present invention. FIGS. 4(*b*)-4(*c*) are schematic diagrams illustrating the distribution of a refractive index corresponding to FIG. 4(*a*). FIG. 4(*a*) is different from FIG. 3(*a*) in the shape of the light blocking structure 10. As illustrated in FIG. 4(*a*), the light blocking structure 10 has a shape of a right-angled triangle in cross section. The shaded areas of the first light curing resin layer 21 are areas blocked by the light blocking structures 10. When the incident light penetrates through the left side of the right triangle, the light blocking structure 10 has a thicker thickness. When the incident light penetrates through the right side of the right triangle, the light blocking structure 10 has a thinner thickness. As a result, as illustrated in FIG. 4(*b*) and FIG. 4(*c*), the first curing level of the shaded area of the first light curing resin layer 21 continuously increases from left side to right side, such that the refractive index of the shaded area continuously increases or decreases from left side to right side.

Figure 5A:
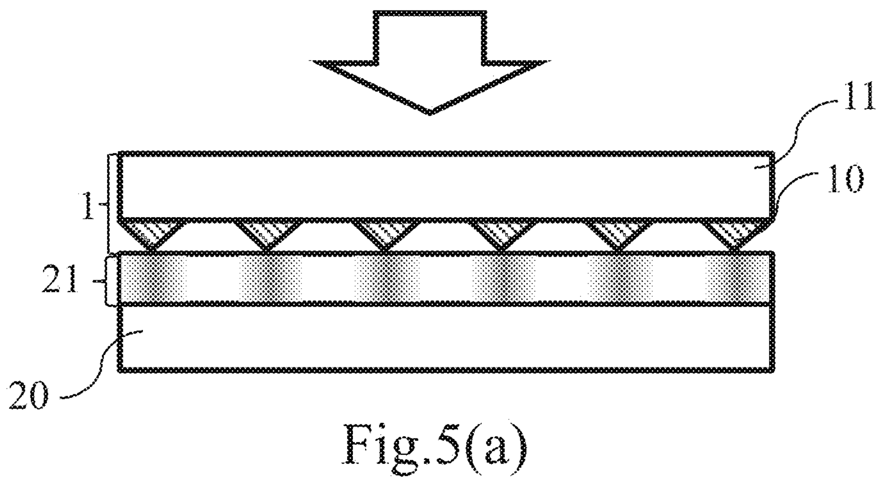
FIG. 5(*a*) is a cross-sectional view of irradiating a photomask, a first light curing resin layer, and a first transparent substrate with ultraviolet light according to yet another embodiment of the present invention.
Figure 5B:
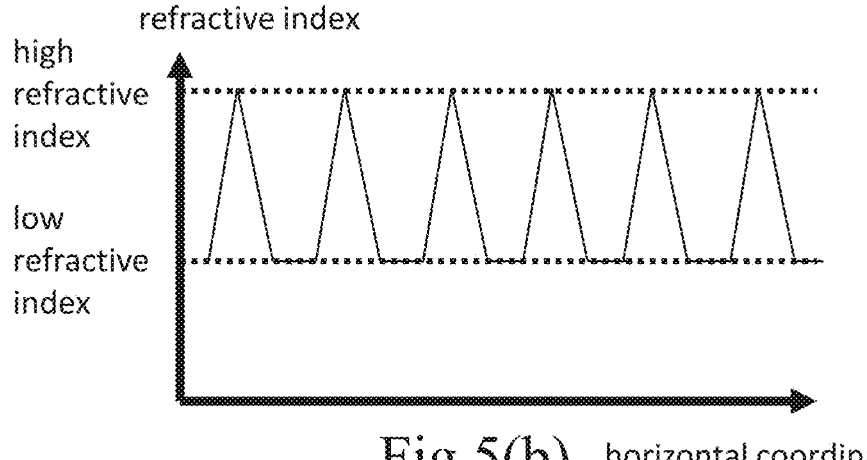
Figure 5C:
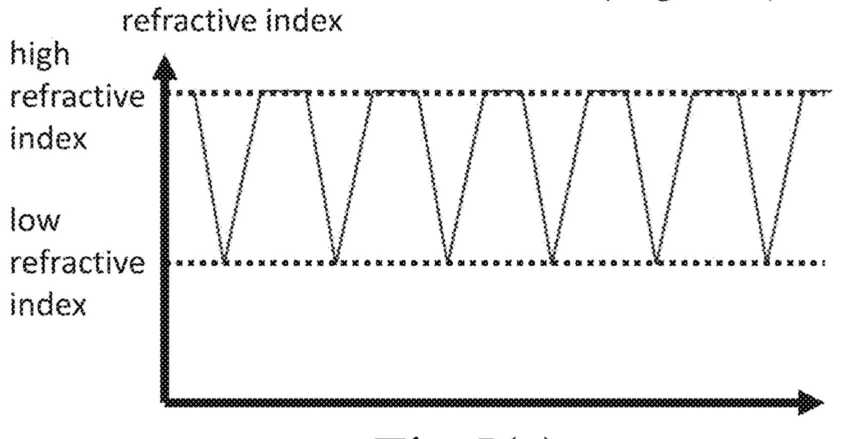

FIG. 5(*a*) is a cross-sectional view of irradiating a photomask, a first light curing resin layer, and a first transparent substrate with ultraviolet light according to yet another embodiment of the present invention. FIGS. 5(*b*)-5(*c*) are schematic diagrams illustrating the distribution of a refractive index corresponding to FIG. 5(*a*). FIG. 5(*a*) is different from FIG. 4(*a*) in the shape of the light blocking structure 10. As illustrated in FIG. 5(*a*), the light blocking structure 10 has a shape of an isosceles triangle in cross section. The shaded areas of the first light curing resin layer 21 are areas blocked by the light blocking structures 10. When the incident light penetrates through the middle area of the isosceles triangle, the light blocking structure 10 has a thicker thickness. When the incident light penetrates through the right or left side of the isosceles triangle, the light blocking structure 10 has a thinner thickness. As a result, as illustrated in FIG. 5(*b*) and FIG. 5(*c*), the first curing level of the shaded area of the first light curing resin layer 21 continuously increases from middle to two sides, such that the refractive index of the shaded area continuously increases or decreases from middle to two sides.

Figure 6A:
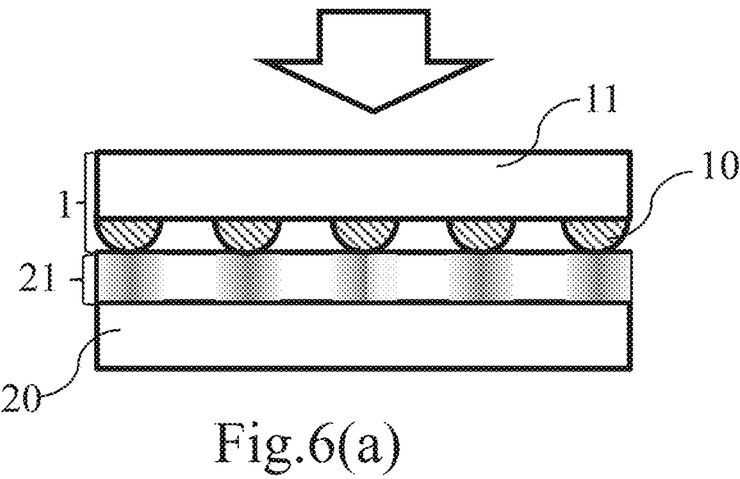
FIG. 6(*a*) is a cross-sectional view of irradiating a photomask, a first light curing resin layer, and a first transparent substrate with ultraviolet light according to yet another embodiment of the present invention.
Figure 6B:
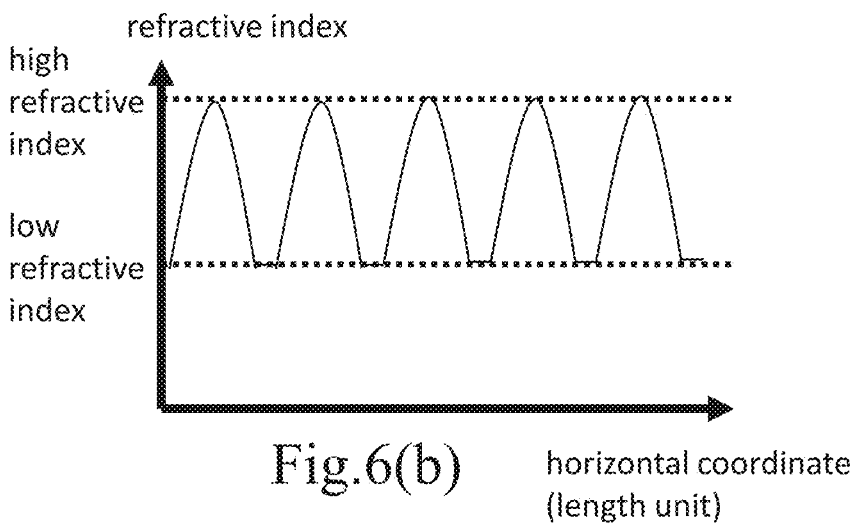
Figure 6C:
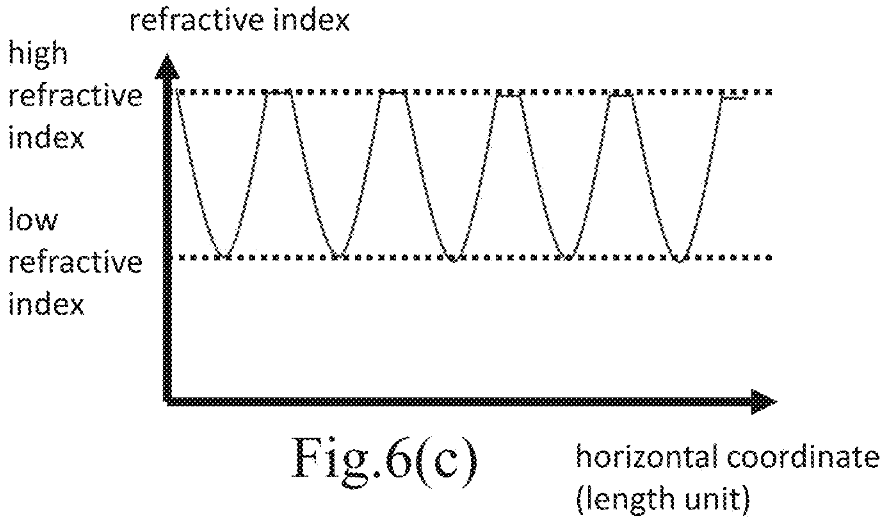

FIG. 6(*a*) is a cross-sectional view of irradiating a photomask, a first light curing resin layer, and a first transparent substrate with ultraviolet light according to yet another embodiment of the present invention. FIGS. 6(*b*)-6(*c*) are schematic diagrams illustrating the distribution of a refractive index corresponding to FIG. 6(*a*). FIG. 6(*a*) is different from FIG. 5(*a*) in the shape of the light blocking structure 10. As illustrated in FIG. 6(*a*), the light blocking structure 10 has a shape of a semicircle in cross section. The shaded areas of the first light curing resin layer 21 are areas blocked by the light blocking structures 10. When the incident light penetrates through the middle area of the semicircle, the light blocking structure 10 has a thicker thickness. When the incident light penetrates through the right or left side of the semicircle, the light blocking structure 10 has a thinner thickness. As a result, as illustrated in FIG. 6(*b*) and FIG. 6(*c*), the first curing level of the shaded area of the first light curing resin layer 21 continuously increases from middle to two sides, such that the refractive index of the shaded area continuously increases or decreases from middle to two sides. In addition to the foregoing shapes, the light blocking structure 10 may have a shape of a polygon, a circle, an oval, a semi-ellipse, a square, a trapezoid, a right-angled trapezoid, or a triangle in cross section.

Figure 7A:
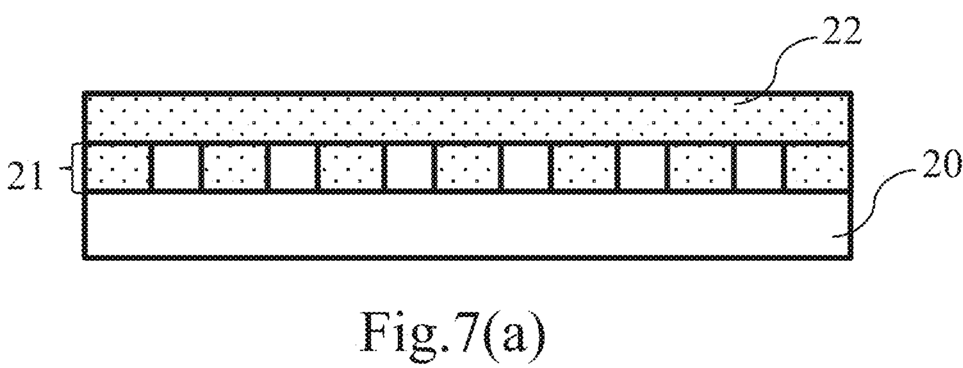
FIGS. 7(*a*)-7(*c*) are schematic diagrams illustrating the steps of a light curing process according to an embodiment of the present invention.
Figure 7B:
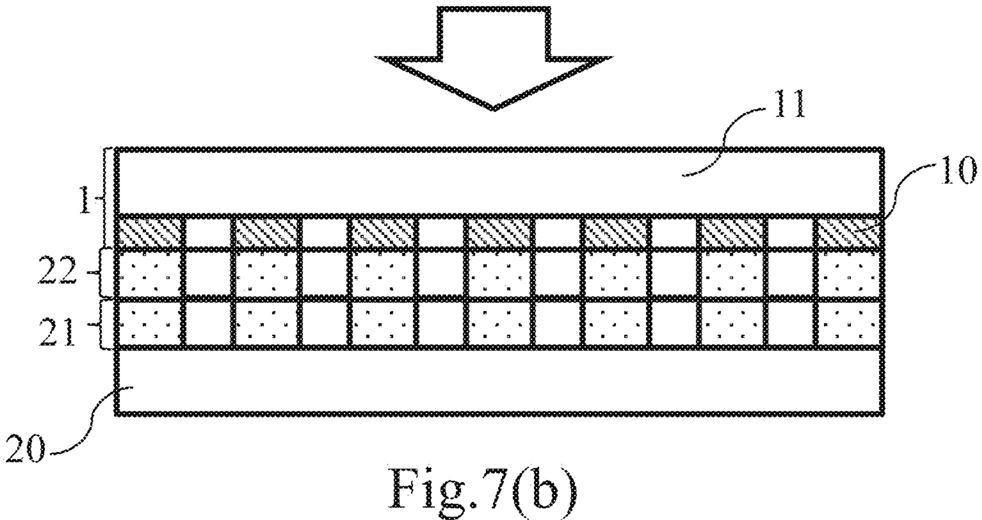
Figure 7C:
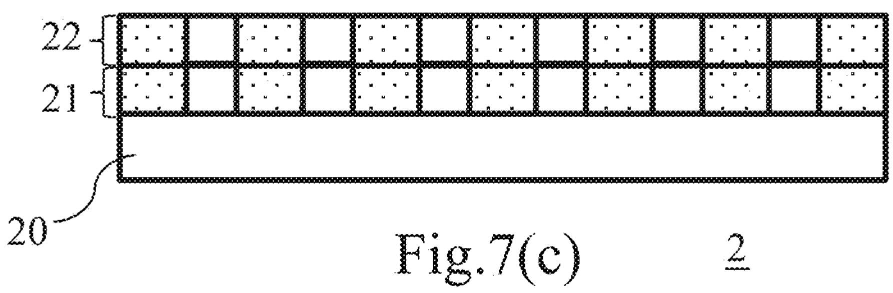

FIGS. 7(*a*)-7(*c*) are schematic diagrams illustrating the steps of a light curing process according to an embodiment of the present invention. After the step of FIG. 1(*c*), at least one light curing process is performed. For clarity and convenience, the embodiment exemplifies one light curing process. As illustrated in FIG. 7(*a*), a second light curing resin layer 22 is formed on the latest formed light curing resin layer, wherein the latest formed light curing resin layer may be the first light curing resin layer 21. The second light curing resin layer 22 may be an ultraviolet light curing resin layer. The second light curing resin layer 22 may include acrylic amine(AA)-based photopolymers, polyvinyl alcohol (PVA)-based photopolymers, acrylate-based photopolymers, thiol-ene based photopolymers, photopolymers doped with nanoparticles, or a combination of these. Then, as illustrated in FIG. 7(*b*), the photomask 1 is placed on the latest formed second light curing resin layer 22, wherein the light blocking structure 10 is directly formed over the dot area of the first light curing resin layer 21. The latest formed second light curing resin layer 22 is to irradiated and cured to have a second curing level and a corresponding second refractive index with the incident light through the photomask 1 and the light blocking structures 10, wherein the second curing level and the second refractive index are periodically distributed. Specifically, a part of energy of the incident light is absorbed or shielded by the light blocking structures 10 and the remaining energy of the incident light is applied to the second light curing resin layer 22. In the embodiment, the first curing level and the second curing level are equal along a direction vertical to the surface of the first transparent substrate 20. The direction of the incident light is represented by an arrow. The blank areas of the second light curing resin layer 22 represent completely cured areas and the dot areas of the second light curing resin layer 22 represent areas blocked by the light blocking structures 10. The incident light is exemplified by ultraviolet light. The quantity of the oxides or ultraviolet light scattering particles of the light blocking structure 10 is negatively correlated with the second curing level of the corresponding second light curing resin layer 22. The thickness of the light blocking structure 10 is negatively correlated with the second curing level of the corresponding second light curing resin layer 22. That is to say, the more energy of ultraviolet light, the light blocking structure 10 absorbs or shields, the lower the second curing level. The less energy of ultraviolet light the light blocking structure 10 absorbs or shields, the higher the second curing level. According to requirements, the second refractive index of the second light curing resin layer 22 is positively or negatively correlated with the corresponding second curing level. Finally, as illustrated in FIG. 7(*c*), the photomask 1 is removed from the latest formed second light curing resin layer 22. The optical waveguide 2 with the first light curing resin layer 21 having the periodically distributed first curing level, the second light curing resin layer 22 having the periodically distributed second curing level, and the first transparent substrate 20 is formed.

Figure 8A:
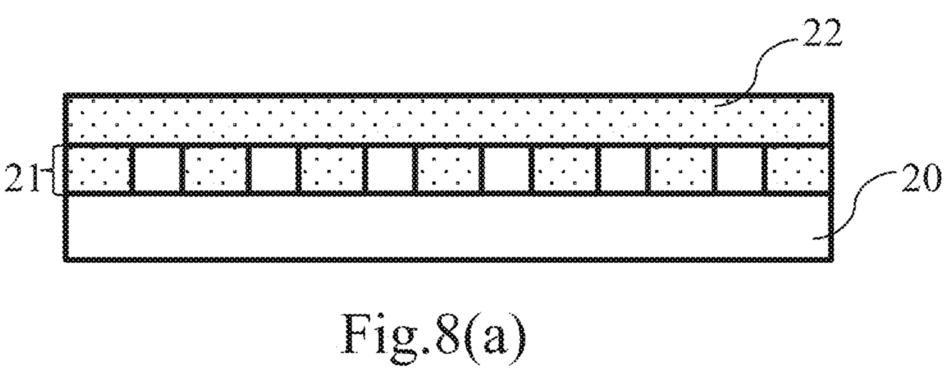
FIGS. 8(*a*)-8(*c*) are schematic diagrams illustrating the steps of a light curing process according to another embodiment of the present invention.
Figure 8B:
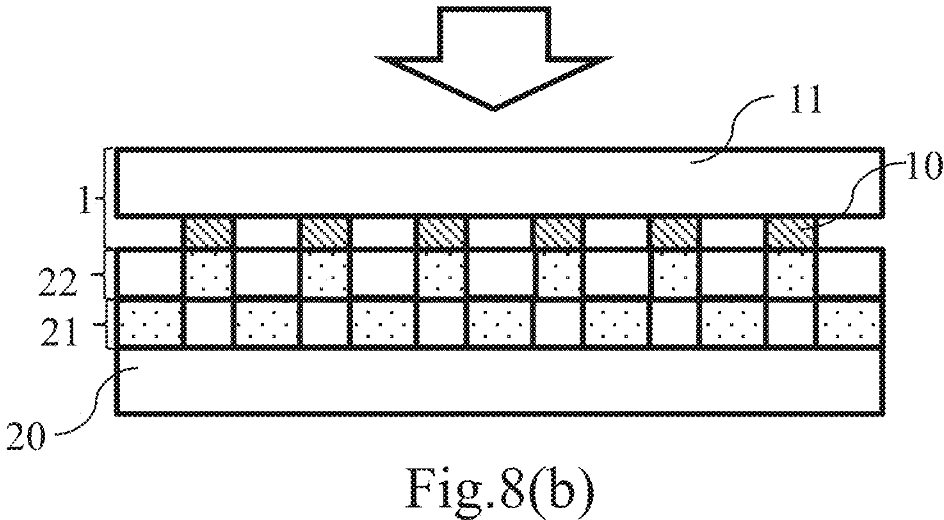
Figure 8C:
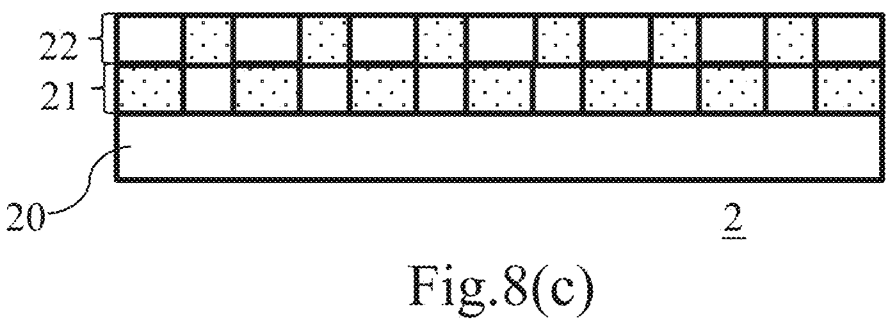

FIGS. 8(*a*)-8(*c*) are schematic diagrams illustrating the steps of a light curing process according to another embodiment of the present invention. The steps of FIGS. 8(*a*)-8(*c*) are similar to those of FIGS. 7(*a*)-7(*c*). FIGS. 8(*a*)-8(*c*) are different from FIGS. 7(*a*)-7(*c*) in that the first curing level and the second curing level are unequal along a direction vertical to the surface of the first transparent substrate 20. The other technical features of FIGS. 8(*a*)-8(*c*) have been described in the previous paragraph, so will not be reiterated.

Figure 9A:
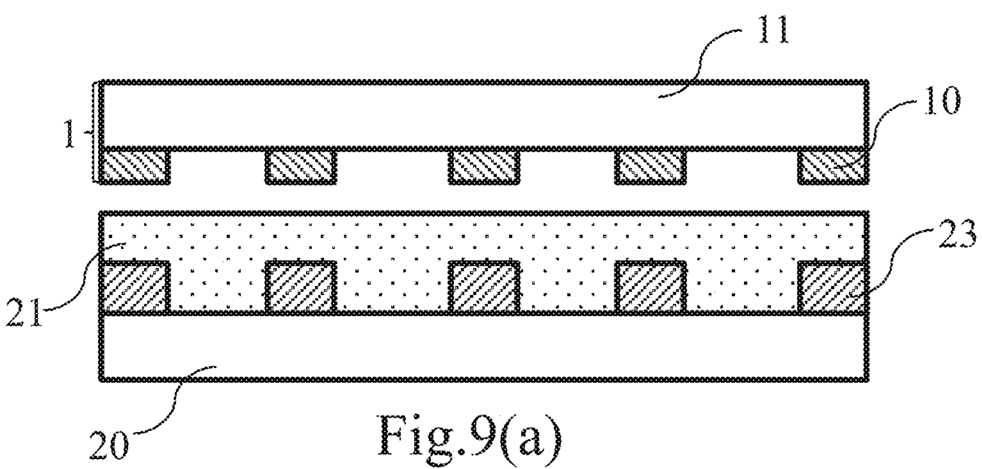
FIGS. 9(*a*)-9(*c*) are schematic diagrams illustrating the steps of fabricating an optical waveguide according to a second embodiment of the present invention.
Figure 9B:
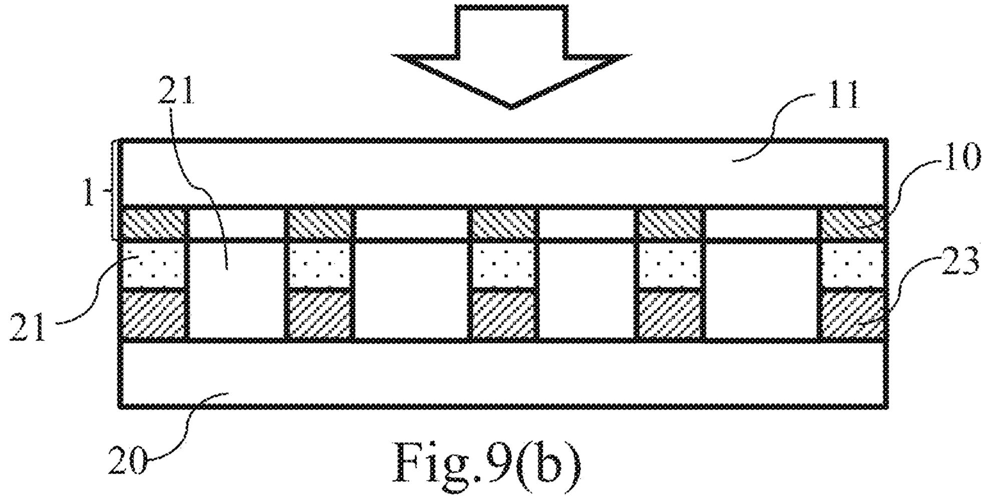
Figure 9C:
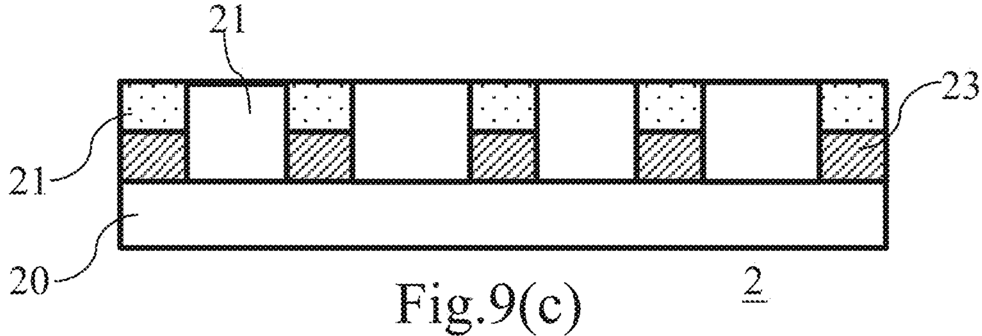

FIGS. 9(*a*)-9(*c*) are schematic diagrams illustrating the steps of fabricating an optical waveguide according to a second embodiment of the present invention. As illustrated in FIGS. 9(*a*)-9(*c*), the second embodiment is different from the first embodiment in that gratings 23 such as surface relief gratings are formed between the first transparent substrate 20 and the first light curing resin layer 21 of the second embodiment. The gratings 23 separate from each other. The gratings 23 and the light blocking structures 10 have the same positions along a direction parallel to the surface of the first transparent substrate 20. Thus, the completely cured area of the first light curing resin layer 21 is formed between the two adjacent gratings 23. The single exposure process is performed on the first light curing resin layer 21 through the photomask 1 to replace the subsequent deposition and etching processes and improve the performance of the surface relief grating waveguide.

Figure 10A:
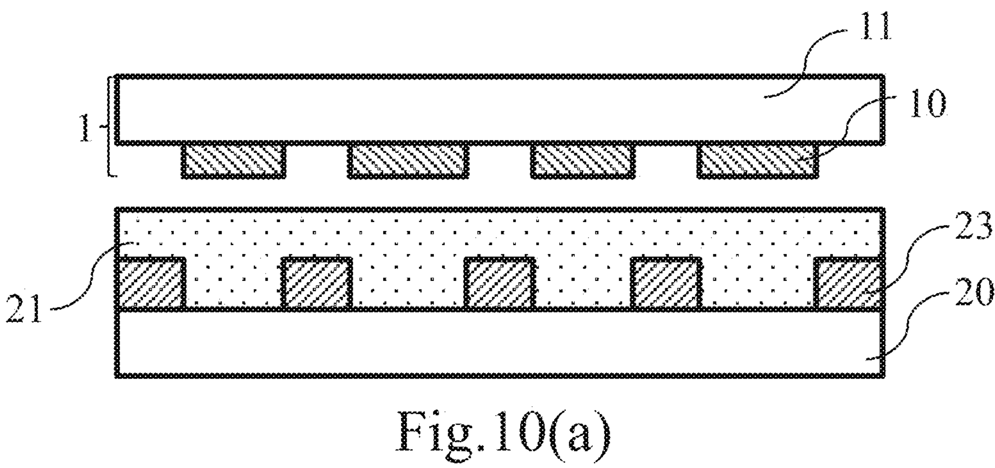
FIGS. 10(*a*)-10(*c*) are schematic diagrams illustrating the steps of fabricating an optical waveguide according to a third embodiment of the present invention.
Figure 10B:
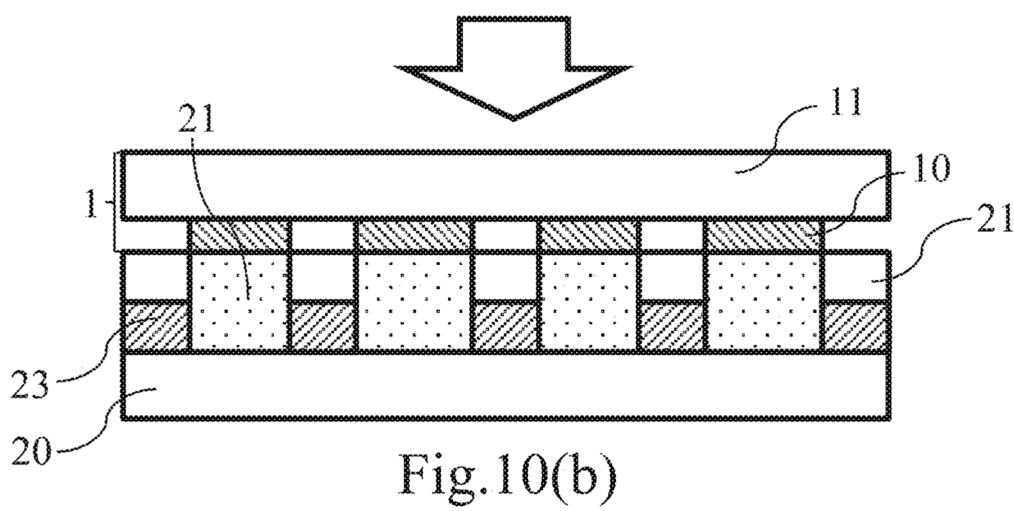
Figure 10C:
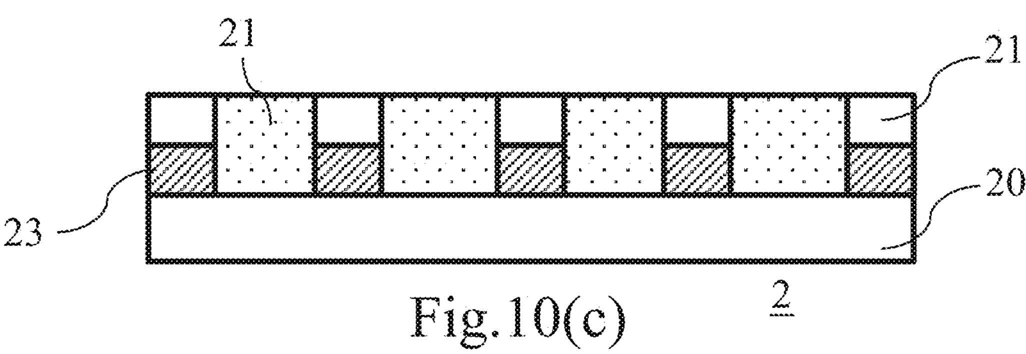

FIGS. 10(*a*)-10(*c*) are schematic diagrams illustrating the steps of fabricating an optical waveguide according to a third embodiment of the present invention. As illustrated in FIGS. 10(*a*)-10(*c*), the third embodiment is different from the second embodiment in that the gratings 23 and the light blocking structures 10 of the third embodiment have different positions along a direction parallel to the surface of the first transparent substrate 20. Thus, the completely cured area of the first light curing resin layer 21 is directly formed over the grating 23.

Figure 11:
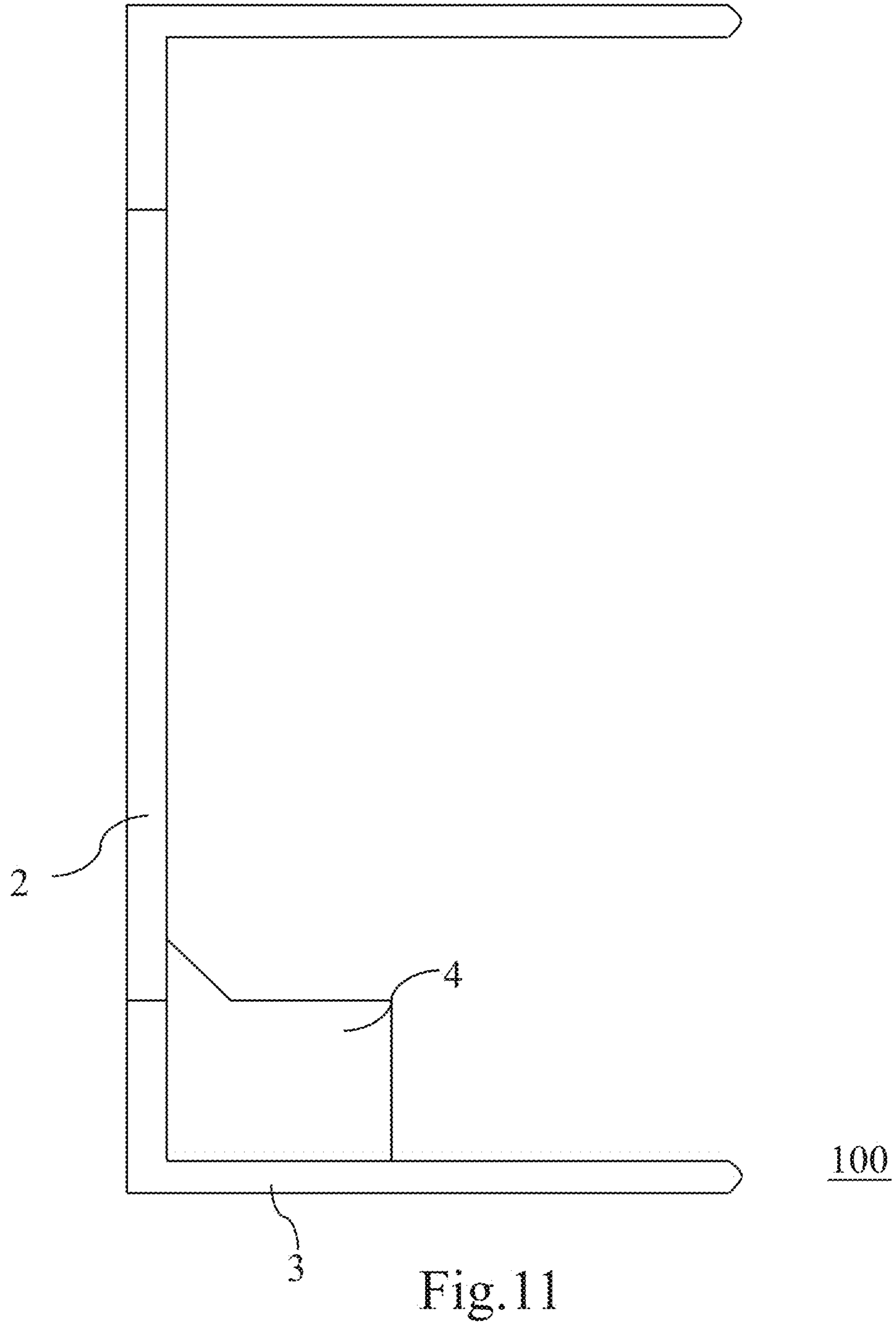
FIG. 11 is a schematic diagram illustrating a display device according to an embodiment of the present invention.

FIG. 11 is a schematic diagram illustrating a display device according to an embodiment of the present invention. After fabricating the optical waveguide 2, a body 3 is connected with a display module 4 and the optical waveguide 2 to form a display device 100, such as a wearable display device, an augmented reality display device or a virtual reality display device. The body 3 is exemplified by a eyeglass frame, but the present invention is not limited thereto. The display module 4 may be a liquid-crystal-on-silicon display module, a digital optical processing module, a micro light emitting diode display module, or other suitable display module.

According to the embodiments provided above, the method uses a single exposure process to form a light curing resin layer with a periodically varying refractive index and a periodically distributed curing level on a grating, such as a surface relief grating waveguide, thereby replacing subsequent deposition and etching processes and improving the performance of the surface relief grating waveguide. The method features low cost and simple fabrication.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A method for fabricating an optical waveguide comprising:

providing a photomask and forming a first light curing resin layer on a first transparent substrate, wherein the photomask has light blocking structures that are regularly distributed;

placing the photomask on the first light curing resin layer;

irradiating and curing the first light curing resin layer to have a first curing level and a corresponding first refractive index with incident light through the photomask and the light blocking structures, wherein the first curing level and the first refractive index are periodically distributed; and removing the photomask from the first light curing resin layer to form an optical waveguide with the first light curing resin layer having a periodically distributed the first curing level and the first transparent substrate;

wherein after the step of removing the photomask from the first light curing resin layer and before the step of forming the optical waveguide with the first light curing resin layer having the periodically distributed the first curing level and the first transparent substrate, at least one light curing process is performed, and the at least one light curing process comprises:

forming a second light curing resin layer on a latest formed the light curing resin layer;

placing the photomask on a latest formed the second light curing resin layer and irradiating and curing the latest formed the second light curing resin layer to have a second curing level and a corresponding second refractive index with the incident light through the photomask and the light blocking structures, wherein the second curing level and the second refractive index are periodically distributed; and removing the photomask from the latest formed the second light curing resin layer, wherein in the step of forming the optical waveguide with the first light curing resin layer having the periodically distributed the first curing level and the first transparent substrate, the optical waveguide with the first light curing resin layer having the periodically distributed the first curing level, the second light curing resin layer having the periodically distributed the second curing level, and the first transparent substrate is formed;

wherein gratings that are spaced at uniform intervals along a direction parallel to a surface of the first transparent substrate are formed between the first transparent substrate and the first light curing resin layer;

wherein the gratings and the light blocking structures have same positions along a direction parallel to the surface of the first transparent substrate;

wherein the first light curing resin layer has completely-cured areas that separate from each other, and the completely-cured areas and the gratings are alternately arranged on the first transparent substrate.

2. The method for fabricating an optical waveguide according to claim 1, wherein the incident light is ultraviolet light.

3. The method for fabricating an optical waveguide according to claim 2, wherein the light blocking structure comprises oxides that absorb the ultraviolet light, ultraviolet light scattering particles or a combination of these.

4. The method for fabricating an optical waveguide according to claim 3, wherein the oxides comprise titanium dioxide, zinc oxide, cerium dioxide or a combination of these.

5. The method for fabricating an optical waveguide according to claim 3, wherein in the step of irradiating the first light curing resin layer with the incident light through the photomask and the light blocking structures, a part of energy of the incident light is absorbed or shielded by the light blocking structures and remaining energy of the incident light is applied to the first light curing resin layer.

6. The method for fabricating an optical waveguide according to claim 5, wherein a quantity of the oxides of the light blocking structure is positively correlated with energy of the ultraviolet light absorbed by the light blocking structure.

7. The method for fabricating an optical waveguide according to claim 5, wherein a quantity of the ultraviolet light scattering particles of the light blocking structure is positively correlated with energy of the ultraviolet light shielded by the light blocking structure.

8. The method for fabricating an optical waveguide according to claim 5, wherein a quantity of the oxides or the ultraviolet light scattering particles of the light blocking structure is negatively correlated with the first curing level of a corresponding the first light curing resin layer.

9. The method for fabricating an optical waveguide according to claim 2, wherein the first light curing resin layer is an ultraviolet light curing resin layer.

10. The method for fabricating an optical waveguide according to claim 9, wherein the first light curing resin layer comprises acrylic amine (AA)-based photopolymers, polyvinyl alcohol (PVA)-based photopolymers, acrylate-based photopolymers, thiol-ene based photopolymers, photopolymers doped with nanoparticles, or a combination of these.

11. The method for fabricating an optical waveguide according to claim 1, wherein the photomask further comprises a second transparent substrate, the second transparent substrate is provided with the light blocking structures, and the light blocking structure has a shape of a polygon, a circle, a semicircle, an oval, or a semi-ellipse in cross section.

12. The method for fabricating an optical waveguide according to claim 11, wherein the polygon is a square, a rectangle, a parallelogram, a trapezoid, a right-angled trapezoid, an isosceles trapezoid, a triangle, a right-angled triangle, or an isosceles triangle.

13. The method for fabricating an optical waveguide according to claim 1, wherein a thickness of the light blocking structure is negatively correlated with a corresponding the second curing level.

14. The method for fabricating an optical waveguide according to claim 1, wherein the second curing level is positively or negatively correlated with the corresponding second refractive index.

15. The method for fabricating an optical waveguide according to claim 1, wherein the first curing level and the second curing level are equal or unequal along a direction vertical to a surface of the first transparent substrate.

16. The method for fabricating an optical waveguide according to claim 1, wherein the second light curing resin layer is an ultraviolet light curing resin layer.

17. The method for fabricating an optical waveguide according to claim 16, wherein the second light curing resin layer comprises acrylic amine (AA)-based photopolymers, polyvinyl alcohol (PVA)-based photopolymers, acrylate-based photopolymers, thiol-ene based photopolymers, photopolymers doped with nanoparticles, or a combination of these.

18. The method for fabricating an optical waveguide according to claim 1, wherein a thickness of the light blocking structure is negatively correlated with the first curing level of a corresponding the first light curing resin layer.

19. The method for fabricating an optical waveguide according to claim 1, wherein the first curing level is positively or negatively correlated with the corresponding first refractive index.

20. A method for fabricating a display device comprising:

providing a photomask and forming a first light curing resin layer on a first transparent substrate, wherein the photomask has light blocking structures that are regularly distributed;

placing the photomask on the first light curing resin layer;

irradiating and curing the first light curing resin layer to have a first curing level and a corresponding first refractive index with incident light through the photomask and the light blocking structures, wherein the first curing level and the first refractive index are periodically distributed;

removing the photomask from the first light curing resin layer to form an optical waveguide with the first light curing resin layer having a periodically distributed the first curing level and the first transparent substrate; and connecting a body with a display module and the optical waveguide to form a display device;

wherein after the step of removing the photomask from the first light curing resin layer and before the step of forming the optical waveguide with the first light curing resin layer having the periodically distributed the first curing level and the first transparent substrate, at least one light curing process is performed, and the at least one light curing process comprises:

forming a second light curing resin layer on a latest formed the light curing resin layer;

placing the photomask on a latest formed the second light curing resin layer and irradiating and curing the latest formed the second light curing resin layer to have a second curing level and a corresponding second refractive index with the incident light through the photomask and the light blocking structures, wherein the second curing level and the second refractive index are periodically distributed; and removing the photomask from the latest formed the second light curing resin layer, wherein in the step of forming the optical waveguide with the first light curing resin layer having the periodically distributed the first curing level and the first transparent substrate, the optical waveguide with the first light curing resin layer having the periodically distributed the first curing level, the second light curing resin layer having the periodically distributed the second curing level, and the first transparent substrate is formed;

gratings that are spaced at uniform intervals along a direction parallel to a surface of the first transparent substrate are formed between the first transparent substrate and the first light curing resin layer;

wherein the gratings and the light blocking structures have same positions along a direction parallel to the surface of the first transparent substrate;

wherein the first light curing resin layer has completely-cured areas that separate from each other, and the completely-cured areas and the gratings are alternately arranged on the first transparent substrate.

21. The method for fabricating a display device according to claim 20, wherein the body is an eyeglass frame.

22. The method for fabricating a display device according to claim 20, wherein the incident light is ultraviolet light.

23. The method for fabricating a display device according to claim 22, wherein the light blocking structure comprises oxides that absorb the ultraviolet light, ultraviolet light scattering particles or a combination of these.

24. The method for fabricating a display device according to claim 23, wherein the oxides comprise titanium dioxide, zinc oxide, cerium dioxide or a combination of these.

25. The method for fabricating a display device according to claim 23, wherein in the step of irradiating the first light curing resin layer with the incident light through the photomask and the light blocking structures, a part of energy of the incident light is absorbed or shielded by the light blocking structures and remaining energy of the incident light is applied to the first light curing resin layer.

26. The method for fabricating a display device according to claim 25, wherein a quantity of the oxides of the light blocking structure is positively correlated with energy of the ultraviolet light absorbed by the light blocking structure.

27. The method for fabricating a display device according to claim 25, wherein a quantity of the ultraviolet light scattering particles of the light blocking structure is positively correlated with energy of the ultraviolet light shielded by the light blocking structure.

28. The method for fabricating a display device according to claim 25, wherein a quantity of the oxides or the ultraviolet light scattering particles of the light blocking structure is negatively correlated with the first curing level of a corresponding the first light curing resin layer.

29. The method for fabricating a display device according to claim 22, wherein the first light curing resin layer is an ultraviolet light curing resin layer.

30. The method for fabricating a display device according to claim 29, wherein the first light curing resin layer comprises acrylic amine (AA)-based photopolymers, polyvinyl alcohol (PVA)-based photopolymers, acrylate-based photopolymers, thiol-ene based photopolymers, photopolymers doped with nanoparticles, or a combination of these.

31. The method for fabricating a display device according to claim 20, wherein the photomask further comprises a second transparent substrate, the second transparent substrate is provided with the light blocking structures, and the light blocking structure has a shape of a polygon, a circle, a semicircle, an oval, or a semi-ellipse in cross section.

32. The method for fabricating a display device according to claim 31, wherein the polygon is a square, a rectangle, a parallelogram, a trapezoid, a right-angled trapezoid, an isosceles trapezoid, a triangle, a right-angled triangle, or an isosceles triangle.

33. The method for fabricating a display device according to claim 20, wherein a thickness of the light blocking structure is negatively correlated with a corresponding the second curing level.

34. The method for fabricating a display device according to claim 20, wherein the second curing level is positively or negatively correlated with the corresponding second refractive index.

35. The method for fabricating a display device according to claim 20, wherein the first curing level and the second curing level are equal or unequal along a direction vertical to a surface of the first transparent substrate.

36. The method for fabricating a display device according to claim 20, wherein the second light curing resin layer is an ultraviolet light curing resin layer.

37. The method for fabricating a display device according to claim 36, wherein the second light curing resin layer comprises acrylic amine (AA)-based photopolymers, polyvinyl alcohol (PVA)-based photopolymers, acrylate-based photopolymers, thiol-ene based photopolymers, photopolymers doped with nanoparticles, or a combination of these.

38. The method for fabricating a display device according to claim 20, wherein a thickness of the light blocking structure is negatively correlated with the first curing level of a corresponding the first light curing resin layer.

39. The method for fabricating an optical waveguide according to claim 20, wherein the first curing level is positively or negatively correlated with the corresponding first refractive index.

* * * * *